Figure 1:
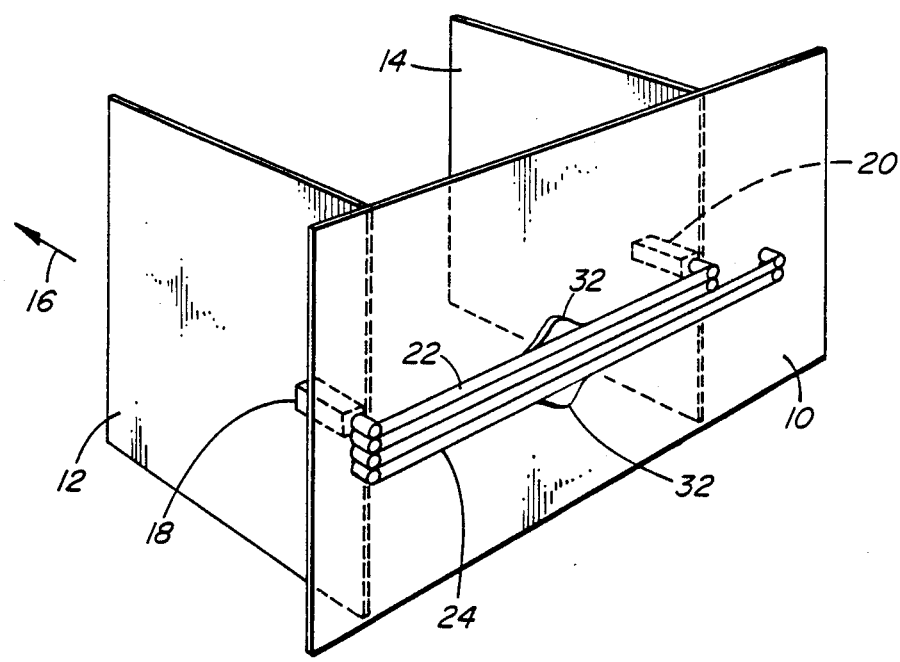

United States Patent [19]
Graves et al.

[11] Patent Number: 4,733,093
[45] Date of Patent: Mar. 22, 1988

[54] ELECTRONIC APPARATUS WITH CIRCUIT CARDS AND SIGNALS OPTICALLY COUPLED THEREBETWEEN

[75] Inventors: Alan F. Graves, Sherwood Park; Ernst A. Munter, Kanata, both of Canada

[73] Assignee: Northern Telecom Limited, Montreal, Canada

[21] Appl. No.: 898,774

[22] Filed: Aug. 19, 1986

Related U.S. Application Data

[63] Continuation of Ser. No. 593,682, Mar. 26, 1984, abandoned.

[51] Int. Cl.⁴ .............................................. G02B 27/00
[52] U.S. Cl. .................................. 250/551; 455/606
[58] Field of Search ............................... 250/227, 551; 350/96.15, 96.2; 455/606, 607, 610, 612

[56] References Cited

U.S. PATENT DOCUMENTS

| | | | |
|---|---|---|---|
| 3,792,284 | 2/1974 | Kaelin | 250/551 |
| 4,063,083 | 12/1977 | Cathey et al. | 250/199 |
| 4,074,142 | 2/1978 | Jackson | 250/551 |
| 4,176,908 | 12/1979 | Wagner | 350/96.2 |
| 4,268,114 | 5/1981 | d'Auria et al. | 350/96.20 |

OTHER PUBLICATIONS

"Optical Transmission System for Interconnecting Electronic Units", Balliet et al., IBM Tech. Disc. Bull., vol. 26 No. 4, 9/83.

*Primary Examiner*—David C. Nelms
*Assistant Examiner*—Stephone B. Allen
*Attorney, Agent, or Firm*—R. John Haley

[57] ABSTRACT

Optical signals are coupled between circuit cards, electrically connected to a backpanel, by means of parallel elongate optical conductors formed by an optically conductive plastics moulding mounted on the backpanel. Each elongate optical conductor ends in an inclined face to direct an optical signal between the optical conductor and an optical signal source or detector on a respective circuit card.

20 Claims, 3 Drawing Figures

ELECTRONIC APPARATUS WITH CIRCUIT CARDS AND SIGNALS OPTICALLY COUPLED THEREBETWEEN

This is a continuation of application Ser. No. 593,682 filed Mar. 26, 1984, now abandoned.

This invention relates to the coupling of signals between circuit cards of electronic apparatus.

Electronic apparatus, such as telecommunications equipment, is commonly arranged on circuit cards which are removably electrically connected to a backpanel comprising a printed circuit board or a series of wires providing electrical connections between the circuit cards. With increasing complexity of electronic apparatus, and with increasingly rapid operation of the apparatus and consequent high frequency signals, problems arise in providing a backpanel which can provide the requisite numbers of connections and signal transmission rates between circuit cards.

For example, a practical limit is reached at a bit (binary digit) transmission rate across a backpanel of the order of 200 Mb/s, beyond which problems become severe. This transmission rate may be provided for example by 80 separate conductors across the backpanel each carrying signals at a bit rate of about 2.5 Mb/s, or 40 conductors carrying signals at a bit rate of 5 Mb/s. If the necessary isolation of these conductors from one another is to be maintained, the bit rate on each conductor can not be increased without increasing the spacing of the conductors, and hence decreasing the number of conductors, and conversely the number of conductors can not be increased without decreasing the bit rate on each conductor. Consequently, the limit of 200 Mb/s, which is used here merely as an example, can not be significantly exceeded.

In order to provide increased signal transmission rates and improved isolation, it is known to convert electrical signals to be transmitted into optical signals, to transmit the optical signals via optical fibers, and to convert the consequently received optical signals back into electrical signals. Such an electro-optic transmission link, whose ends are terminated in electrical connectors, is described in Kaelin U.S. Pat. No. 3,792,284 issued Feb. 12, 1974. Such a transmission link, however, is not readily applicable to electronic apparatus having circuit cards and a backpanel as described above, because the large numbers of links between numerous circuit cards would give rise to problems in accommodating the links and connectors, providing access to the cards for inserting and removing the connectors, and enabling removal of individual circuit cards during operation of the apparatus, as may be desired for repair and maintenance.

It is also known from d'Auria et al. U.S. Pat. No. 4,268,114 issued May 19, 1981 to provide an optical connector for a printed circuit card, in which an electro-optic device is optically coupled to a short length of fiber which projects within a connector from an edge of the printed circuit card so as to be insertable within a complementary connector positioned in a wall of a box. Whilst this arrangement provides optical coupling between the printed circuit card and a fixed member such as the box, this is achieved at the cost of considerable complexity, and great care must be taken in uniting the connectors to ensure proper alignment and consequent optical coupling, so that the printed circuit card can not be freely and rapidly removed and replaced as is desired as described above.

An object of this invention, therefore, is to provide electronic apparatus which facilitates providing increased signal transmission rates between circuit cards.

According to this invention there is provided electronic apparatus comprising: a backpanel; a plurality of circuit cards arranged perpendicularly to and electrically connected to the backpanel; optical coupling means on said circuit cards for emitting optical signals to and/or receiving optical signals from the backpanel; and an optically conductive plastics moulding on the backpanel for coupling the optical signals between the circuit cards.

Thus in accordance with the invention a plastics moulding on the backpanel is used to couple optical signals between circuit cards. Such a plastics moulding has several advantages over conventional optical fibers, notably strength and durability, and the lack of any need for precision optical connectors between the circuit cards and the backpanel, with consequent ease of assembly. Furthermore, a single plastics moulding can carry multiple optical signals. Consequently, the plastics moulding provides a very considerable cost saving compared with the costs of using optical fiber connectors.

Although the plastics moulding may have very high losses compared with those of good quality optical fiber, for example up to 1000 dB per kilometer compared with 1 dB per kilometer for fiber, these are of no consequence as the path length is short (typically 0.2 to 1 meter) and hence the transmission loss within the electronic apparatus is negligible, for example 0.5 dB loss in a distance of about 50 centimeters. Similarly, although signal losses between the optical coupling means and the plastics moulding may be quite high (e.g. 3 to 10 dB), the total losses are sufficiently small that they do not adversely affect the desired optical coupling between the circuit cards.

In a preferred embodiment of the invention the plastics moulding comprises a plurality of parallel elongate optical conductors each having reflecting means at the ends thereof for directing a respective optical signal to and receiving the respective optical signal from the optical coupling means of respective circuit cards. Such an arrangement enables a large number of optical signals to be readily coupled among an arbitrary number of circuit cards.

The reflecting means at each end of each optical conductor can comprise a face of the conductor inclined at an angle of 45° to the length of the optical conductor. Such inclined faces can be silvered to provide reflection, but preferably the plastics moulding has a refractive index which is sufficiently high that total internal reflection of said optical signals takes place at said inclined faces of the optical conductors. Alternatively, the reflecting means can comprise two faces of the conductor inclined at angles of 22½° and 67½° to the length of the optical conductor and arranged to provide two successive total internal reflections of the optical signals each through an angle of 45°, whereby a lower refractive index plastics moulding can be used without requiring silvering of the faces.

In a particularly convenient arrangement of the invention, the plastics moulding is disposed on the backpanel on the opposite side of the circuit cards, and each optical conductor includes at each end thereof a respective optically conductive extension which extends from the reflecting means through the backpanel to a position adjacent to the respective optical coupling. This enables the optical conductors to be positioned so that they do not obstruct the circuit cards, the optically conductive extensions coming into close proximity with the optical coupling means on the circuit cards to keep signal losses to an acceptable level. This arrangement may further include hollow tubular flexible dust seals each surrounding a respective optically conductive extension and extending beyond the free end thereof for engagement with the respective optical coupling means, the dust seals serving to exclude, from the spaces between the optically conductive extensions and the optical coupling means, dust which could give rise to excessive optical signal losses.

Conveniently each optical coupling means comprises a focussing lens and an optical signal emitter or receiver disposed at a focal point of said lens whereby each optical signal is a substantially parallel optical signal beam.

Preferably the circuit cards are arranged in parallel planes and are removably electrically connected to the backpanel. As is desirable in electronic apparatus, the removal of individual circuit cards in apparatus in accordance with embodiments of this invention can be readily achieved without disturbing optical coupling of signals among other circuit cards.

Figure 2:
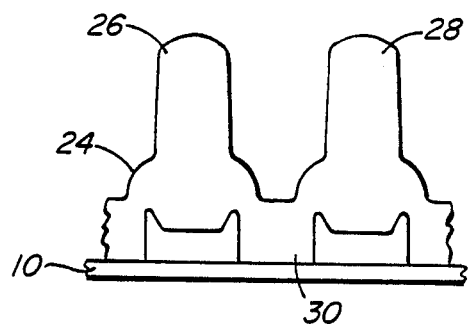
Figure 3:
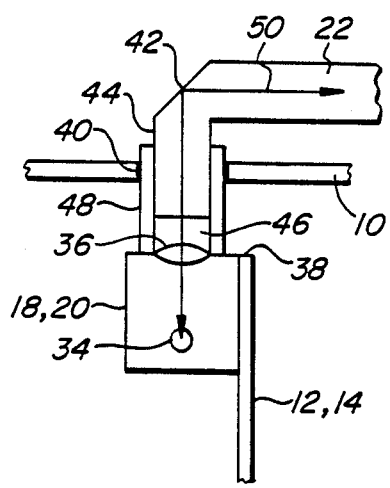

Advantageously the plastics moulding comprises means integrally moulded therewith for mounting said plastics moulding on the backpanel. This enables the plastics moulding to be conveniently attached to the backpanel while at the same time being produced at a relatively low cost. The plastics moulding can further comprise means integrally moulded therewith for preventing light coupling between the parallel elongate optical conductors, without adding significantly to its cost. The invention will be further understood from the following description with reference to the accompanying drawings, in which:

FIG. 1 schematically illustrates parts of electronic apparatus in accordance with an embodiment of the invention, showing only those parts necessary for a full understanding of the invention;

FIG. 2 illustrates a cross-sectional view of part of a plastics moulding of the apparatus of FIG. 1, which plastics moulding constitutes a plurality of elongate optical conductors; and FIG. 3 illustrates in greater detail the optical coupling between a circuit card and an elongate optical conductor.

Referring to FIG. 1, there is shown therein a backpanel 10 and two printed circuit cards 12 and 14 of an electronic apparatus. The circuit cards 12 and 14, and other circuit cards which are not shown, are arranged side by side closely spaced apart in parallel planes, and are all electrically connected to the backpanel, which is in a plane perpendicular to the circuit cards, via electrical connectors (not shown) of known form and in known manner. As is well known, each circuit card is removable from the backpanel 10 in a direction away therefrom; for example the circuit card 12 is removable by being pulled in the direction of an arrow 16. This facilitates repair, maintenance, and replacement of circuit cards.

In addition to the conventional electrical connector(s) each circuit card has, at its back edge adjacent to the backpanel 10, at least one optical coupling device which serves to emit optical signals to and/or receive optical signals from the backpanel. For clarity, FIG. 1 illustrates only one such optical coupling device on each of the circuit cards 12 and 14 for coupling one optical signal from the card 12 to the card 14. However, each circuit card may include an arbitrary number of optical coupling devices for coupling an arbitrary number of optical signals in both directions to and from arbitrary other circuit cards.

Thus FIG. 1 illustrates an optical signal emitter 18 on the circuit card 12, and a corresponding optical signal receiver 20 on the circuit card 14. An optical signal from the emitter 18 is conducted to the receiver 20 via an elongate optical conductor 22 which forms part of an optically conductive plastics moulding 24 which is mounted on the backpanel 10, on the side thereof away from the circuit cards, as is further described below.

The plastics moulding 24, the illustration of which in FIG. 1 is merely given by way of example, consists of a plurality of parallel elongate optical conductors such as the optical conductor 22, arranged side by side and each extending between optical coupling devices on two different circuit cards. FIG. 2 shows a cross-section of part of the plastics moulding 24 showing two elongate optical conductors 26, 28 which are joined together along their lengths by an elongate portion 30 designed to trap stray light to reduce light coupling between the optical conductors 26, 28 and optionally to abut the backpanel 10 to provide physical support to the plastics moulding 24. The portion 30 may further provide a desired spacing of the optical conductors from the surface of the backpanel 10, the printed wiring on which may extend under the plastics moulding 24. The position of the backpanel 10 is also shown in FIG. 2.

The plastics moulding 24 as described above can be moulded in an optically clear plastics material using known one-shot moulding techniques. Alternatively, the plastics moulding 24 can be moulded using known two-shot moulding techniques, the elongate portion 30 being formed from optically opaque plastics material and the elongate optical conductors 26, 28 being formed from optically clear plastics material. This two-shot moulding can be used instead of or in addition to designing the portion 30 to trap stray light between the optical conductors.

The plastics moulding 24 is thus a substantially solid integral moulding which is firmly secured to the backpanel 10, in contrast to fragile optical fibers of the prior art. To facilitate mounting to the backpanel 10, the plastics moulding 24 includes integrally moulded fixing lugs 32 which may be secured to the backpanel 10 in any known manner.

FIG. 3 illustrates in detail the manner in which optical signals are coupled between the optical coupling devices on the circuit cards and the elongate optical conductors of the plastics moulding 24. For the sake of clarity, FIG. 3 does not illustrate any electrical coupling between the backpanel 10 and the circuit card 12 or 14, but this is provided in known manner. As illustrated in FIG. 3, each optical coupling device 18 or 20 consists of an optical source or detector 34 which is positioned at the focal point of a focussing lens 36 positioned at the back edge 38 of the respective circuit card 12 or 14, whereby a parallel optical signal beam can be emitted to or received from the backpanel 10.

The backpanel 10 includes a hole 40 which is directly opposite the lens 36 when the circuit card 12 or 14 is electrically connected to the backpanel. The respective elongate optical conductor 22 of the plastics moulding 24 ends directly behind this hole 40 in an inclined face 42, from which an optically conductive extension 44, which is an integral part of the plastics moulding 24, extends forwards a short distance into and through the hole 40. An optical signal is thereby directed between the optical source or detector 34 and the elongate optical conductor 22 via the face 42, which is inclined at an angle of 45° to the length of the optical conductor 22 to provide a reflection of the optical signal through an angle of 90°, the optically conductive extension 44, and a small air gap 46 between the free square end of the extension 44 and the lens 36, as shown by a line 50.

In order to exclude dust from the air gap 46, a hollow flexible tubular dust seal or shroud 48 is positioned surrounding the extension 44 within the hole 40 and extending beyond the free end of the extension 44 into engagement with the lens 36 so as to form a light frictional seal therewith.

The plastics moulding 24 is selected to be of a material that has a sufficiently high refractive index that total internal reflection of the optical signal takes place at the inclined face 42, thereby obviating the need for silvering of this face. Alternatively this face may be silvered to provide adequate reflection of the optical signal, or a lower refractive index material may be used and the single face 42 replaced by two faces providing successive total internal reflections of the optical signal through angles of 45°.

The lens 36 can be attached to the circuit card 12 or 14 as described above, or it can be attached to the backpanel 10. As a further alternative, the lens 36 can be moulded at the end of the optical conductor as an integral part of the plastics moulding 24.

Numerous other modifications, variations, and adaptations may be made to the particular embodiment of the invention described above without departing from the scope of the invention, which is defined by the claims.

What is claimed is:

1. Electronic apparatus comprising:
   a backpanel;
   a plurality of circuit cards arranged perpendicularly to and electrically connected to the backpanel;
   optical coupling means on said circuit cards for emitting optical signals to or receiving optical signals from the backpanel; and
   an optically conductive plastics moulding on the backpanel for coupling the optical signals between the circuit cards.

2. Apparatus as claimed in claim 1 wherein said optical coupling means comprises a focussing lens and an optical signal emitter or receiver disposed at a focal point of said lens whereby each optical signal is a substantially parallel optical signal beam.

3. Apparatus as claimed in claim 1 wherein the circuit cards are arranged in parallel planes and are removably electrically connected to the backpanel.

4. Apparatus as claimed in claim 1 wherein the plastics mounding comprises means integrally moulded therewith for mounting said plastics moulding on the backpanel.

5. Apparatus as claimed in claim 1 wherein the plastics moulding comprises a plurality of parallel elongate optical conductors each having reflecting means at the ends thereof for directing a respective optical signal to and receiving the respective optical signal from the optical coupling means of respective circuit cards.

6. Apparatus as claimed in claim 1 wherein the plastics moulding comprises an elongate optical conductor having reflecting means for receiving an optical signal from and directing an optical signal to the optical coupling means of respective circuit cards.

7. Apparatus as claimed in claim 5 wherein the reflecting means at each end of each optical conductor comprises two end faces of the conductor inclined at angles to the length of the conductor and arranged such that total internal reflection of said optical signals takes place sucessively at said two end faces through a total angle of 90°.

8. Apparatus as claimed in claim 5 wherein the plastics moulding comprises means integrally moulded therewith for mounting said plastics moulding on the backpanel.

9. Apparatus as claimed in claim 5 wherein the plastics moulding comprises means integrally moulded therewith for preventing light coupling between the parallel elongate optical conductors.

10. Apparatus as claimed in claim 5 wherein the reflecting means at each end of each optical conductor comprises a face of the conductor inclined at an angle of 45° to the length of the optical conductor.

11. Apparatus as claimed in claim 5 wherein the plastics moulding is disposed on the backpanel on the opposite side of the circuit cards, and each optical conductor includes at each end thereof a respective optically conductive extension which extends from the reflecting means through the backpanel to a position adjacent to the respective optical coupling means.

12. Apparatus as claimed in claim 10 wherein the plastics moulding has a refractive index which is such that total internal reflection of said optical signals takes place at said inclined faces of the optical conductors.

13. Apparatus as claimed in claim 11 and including hollow tubular flexible dust seals each surrounding a respective optically conductive extension for engagement with the respective optical coupling means.

14. Apparatus as claimed in claim 6 wherein the reflecting means comprises faces of the optical conductor each inclined at an angle of 45° to the length of the optical conductor.

15. Apparatus as claimed in claim 6 wherein the reflecting means comprises, at each end of the optical conductor, two end faces of the optical conductor inclined at angles to the length of the optical conductor and arranged such that total internal reflection of said optical signal takes place successively at said two end faces through a total angle of 90°.

16. Apparatus as claimed in claim 6 wherein the plastics moulding is disposed on the backpanel on the opposite side of the circuit cards, and the optical conductor includes optically conductive extensions each of which extends from a respective reflecting means through the backpanel to a position adjacent to the respective optical coupling means.

17. Apparatus as claimed in claim 6 wherein the reflecting means comprises, at each end of the optical conductor, an end face inclined at an angle of 45° to the length of the optical conductor.

18. Apparatus as claimed in claim 17 wherein the plastics moulding has a refractive index which is such that total internal reflection of said optical signal takes place at each end face of the optical conductor.

19. Apparatus as claimed in claim 16 and including hollow tubular flexible dust seals each surrounding a respective optically conductive extension for engagement with the respective optical coupling means.

20. Electronic apparatus comprising:
   a backpanel;
   a plurality of circuit cards arranged in parallel planes perpendicularly to the backpanel, the circuit cards being removably electrically connected to the backpanel;
   optical signal emitting means on a first circuit card for emitting an optical signal to the backpanel;
   optical signal receiving means on a second circuit card for receiving an optical signal from the backpanel; and
   an optically conductive plastics member on the backpanel for coupling the optical signal emitted by the optical signal emitting means to the optical signal receiving means.

* * * * *